(12) United States Patent
Sullivan

(10) Patent No.: US 6,356,853 B1
(45) Date of Patent: Mar. 12, 2002

(54) ENHANCING VOLTMETER FUNCTIONALITY

(76) Inventor: Daniel B. Sullivan, 115 Honeysuckle La., Durham, NC (US) 27703-9269

( * ) Notice: Subject to any disclaimer, the term of this patent is extended or adjusted under 35 U.S.C. 154(b) by 0 days.

(21) Appl. No.: 09/472,425

(22) Filed: Dec. 27, 1999

Related U.S. Application Data

(63) Continuation-in-part of application No. 09/360,066, filed on Jul. 23, 1999, now abandoned.

(51) Int. Cl.⁷ .................. G01R 27/28; G01R 31/00; G01R 31/14; G01R 31/08

(52) U.S. Cl. .................. 702/117; 702/64; 324/522; 324/537

(58) Field of Search .................. 702/64, 65, 108, 702/117–121, 126, 182–185; 324/537, 126, 115, 99 D, 72.5, 522

(56) References Cited

U.S. PATENT DOCUMENTS

| | | | |
|---|---|---|---|
| 2,432,013 A | * 12/1947 | Hanson | 324/713 |
| 2,785,378 A | * 3/1957 | Robinson | 324/101 |
| 4,001,686 A | * 1/1977 | Radichel | 324/524 |
| 4,409,732 A | * 10/1983 | Poff | 29/825 |
| 4,709,366 A | * 11/1987 | Scott et al. | 714/46 |
| 4,720,671 A | 1/1988 | Tada | 324/73.1 |
| 4,777,430 A | * 10/1988 | Schabaner | 324/659 |
| 4,808,915 A | * 2/1989 | Russell | 714/734 |
| 4,884,034 A | * 11/1989 | Guzman | 324/529 |
| 5,276,355 A | 1/1994 | Nagata | 307/80 |
| 5,870,451 A | * 2/1999 | Winkler et al. | 379/26 |
| 5,952,821 A | 9/1999 | Gillette | 324/158.1 |

* cited by examiner

*Primary Examiner*—Marc S. Hoff
*Assistant Examiner*—Manuel L. Barbee
(74) *Attorney, Agent, or Firm*—Akin, Gump, Strauss, Hauer & Feld LLP

(57) ABSTRACT

Enhanced voltmeter leads includes load circuitry having a test load that can be switchably coupled between the leads to help identify faults in a circuit under test. In certain embodiments, the value of the test load can be any appropriate value set according to parameters or characteristics of the circuit under test. In these embodiments, the value of the test load can be set manually or automatically or both. The types of faults that can be identified include a short-to-ground, an open circuit, and a high (e.g., corrosive) resistance. The leads include a switch whose setting is adjustable to couple and decouple the test load between the leads. The switch can be located in the leads or in a lead handle of the leads for easy access by a user/technician. The leads can also include a fuse or circuit breaker for safety reasons. The leads can be used systematically to help identify the type and location of a fault from voltage readings. The voltage readings are obtained at various points in the circuit under test with the switch both closed and open. Conventional test leads or the leads that include the switch to couple/decouple the test load can be used if the load circuitry is integrated into the voltmeter or if the load circuitry has a separate coupling or connection to the voltmeter inputs.

44 Claims, 15 Drawing Sheets

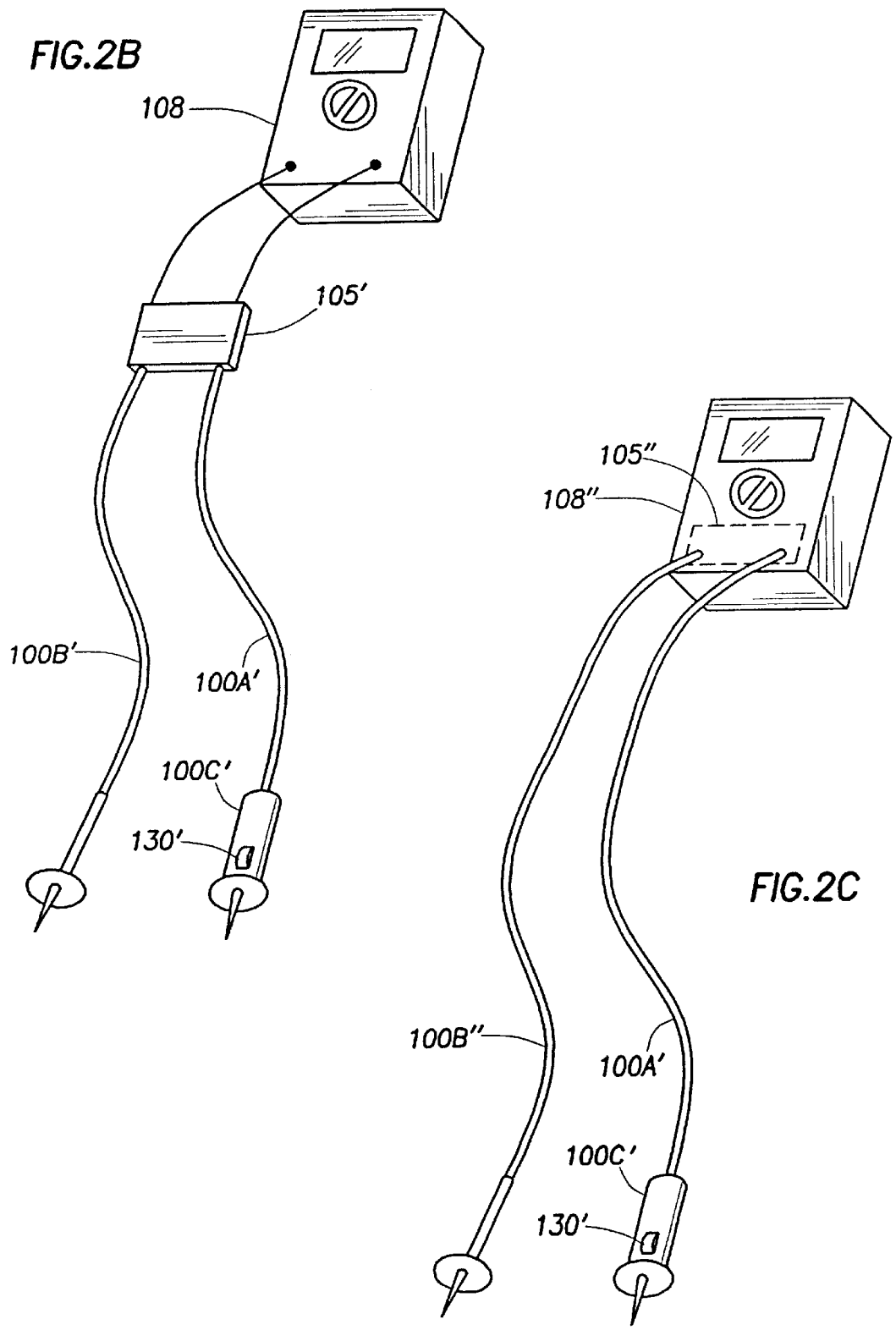

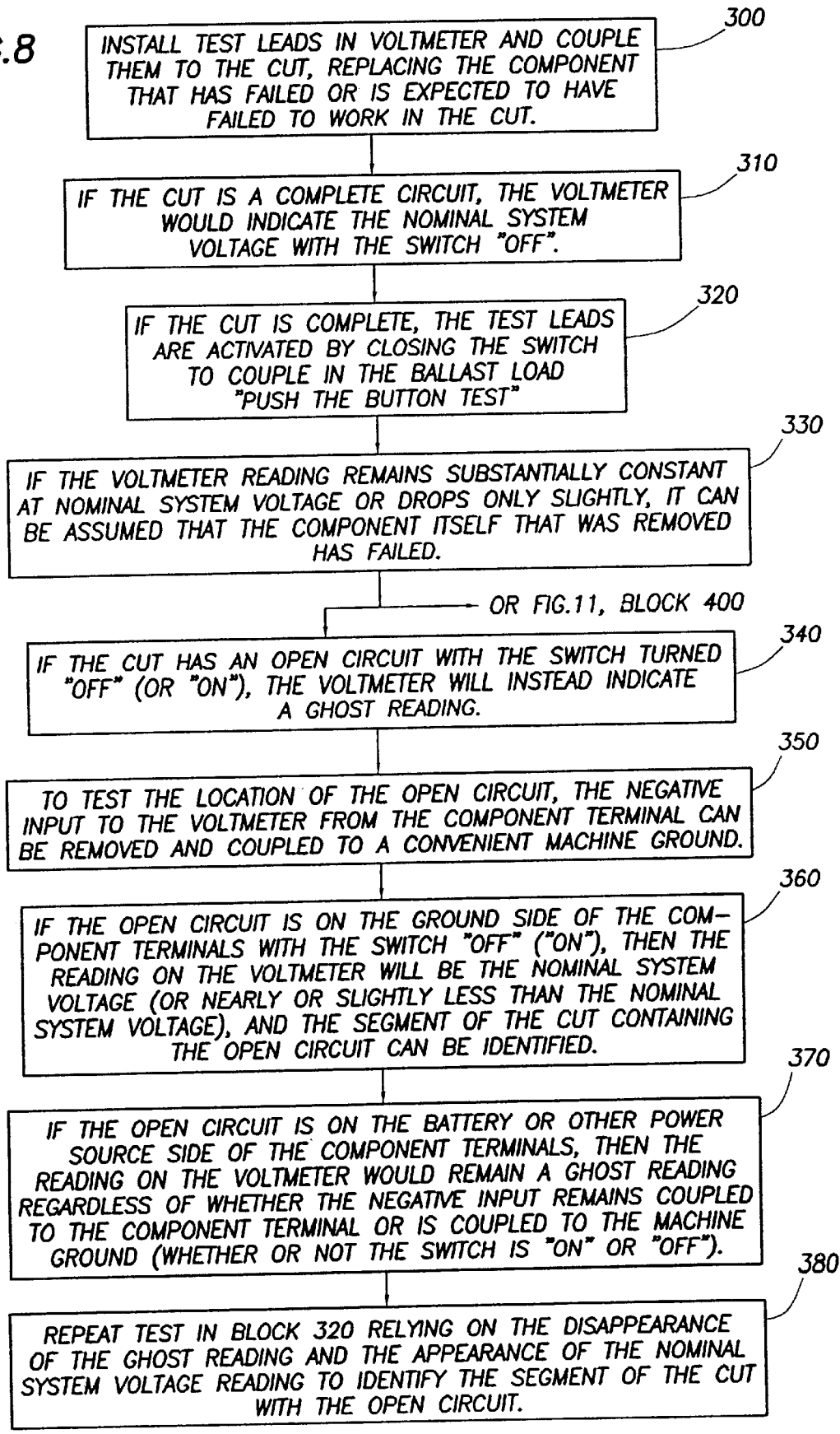

FIG. 11    FROM BLOCK 330, FIG.8

400 — IF THE VOLTMETER READING DROPS SIGNIGICANTLY FROM THE NOMINAL SYSTEM VOLTAGE (SWITCH "OFF"), OR FROM THE NEARLY OR SLIGHTLY LESS THAN NOMINAL SYSTEM VOLTAGE (SWITCH "ON"), THEN THERE WOULD BE A HIGH RESISTANCE FAULT IN THE CUT.

410 — WITH THE SWITCH "OFF", WHETHER OR NOT THE HIGH RESISTANCE FAULT IS ON THE GROUND SIDE OR THE BATTERY OR OTHER POWER SOURCE SIDE OF THE COMPONENT TERMINALS, THE VOLTAGE OF THE VOLTMETER WOULD READ THE NOMINAL SYSTEM VOLTAGE, AS THERE IS NO CURRENT FLOW IN THE CUT.

420 — WITH THE SWITCH "ON", THE VOLTMETER WOULD READ A VOLTAGE DIVIDED VALUE LOWER THAN THE NEARLY OR SLIGHTLY LESS THAN NOMINAL SYSTEM VOLTAGE.

430 — REMOVE NEGATIVE INPUT TEST LEAD FROM THE COMPONENT TERMINAL AND COUPLE IT TO A CONVENIENT MACHINE GROUND.

440 — SAME OBSERVATIONS ARE MADE AS DESCRIBED IN BLOCK 420.

450 — WITH THE SWITCH "ON" (OR "OFF"), IF THE VOLTMETER READING RISES TO, OR NEARLY TO, OR IS SLIGHTLY LESS THAN, THE NOMINAL SYSTEM VOLTAGE (OR RISES TO THE SYSTEM VOLTAGE), THEN THE HIGH RESISTANCE FAULT IS LOCATED ON THE GROUND SIDE OF THE CUT.

460 — IF THE READING REMAINS SUBSTANTIALLY CONSTANT (i.e., LOW AS IN BLOCK 420), THEN THE HIGH RESISTANCE FAULT IS LOCATED ON THE BATTERY OR OTHER POWER SOURCE SIDE OF THE COMPONENT TERMINALS.

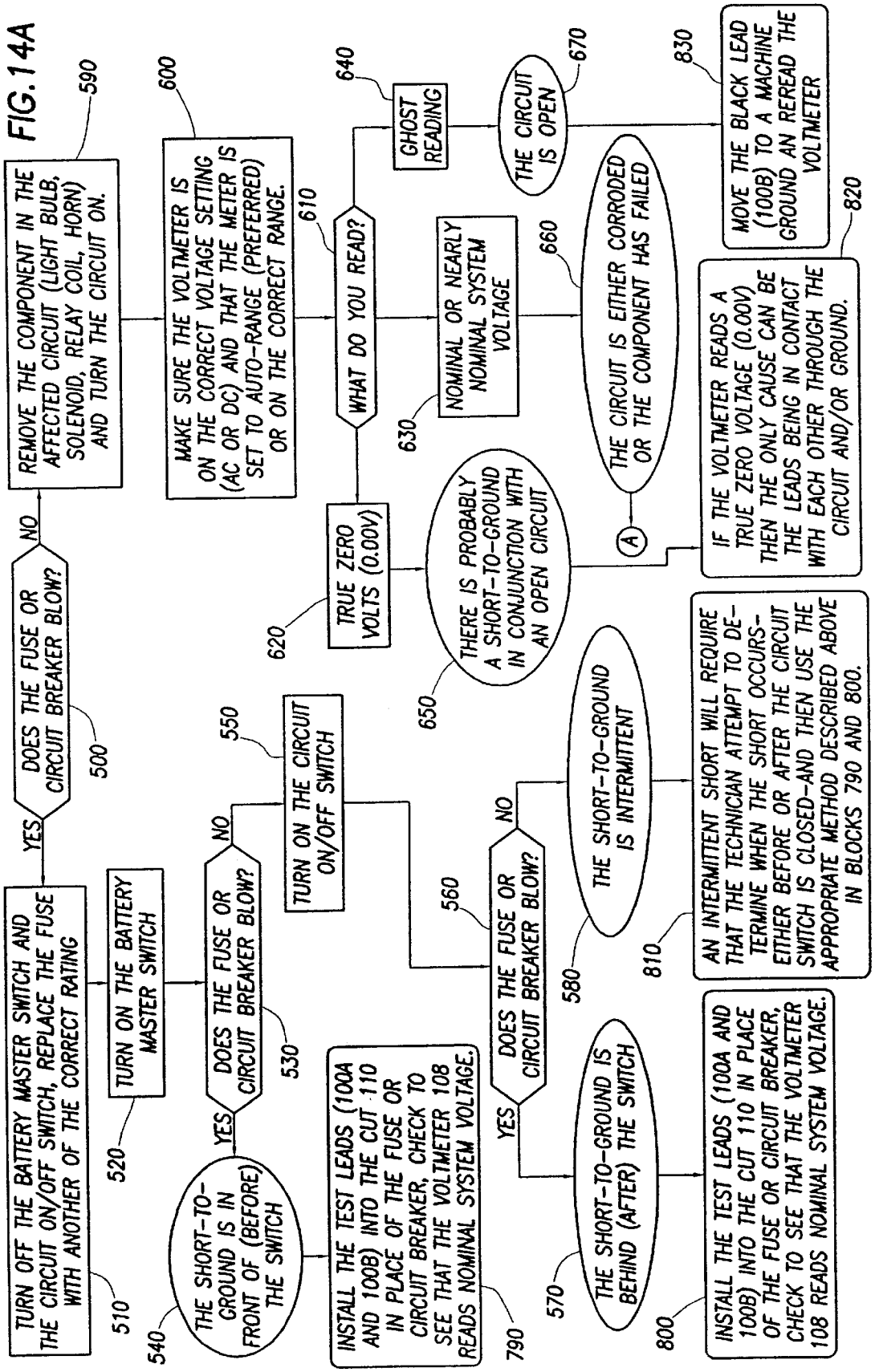

ENHANCING VOLTMETER FUNCTIONALITY

RELATED APPLICATIONS

This is a continuation-in-part of Ser. No. 09/360,066, filed Jul. 23, 1999, abandoned.

BACKGROUND OF THE INVENTION

1. Field of the Invention

The invention relates to enhancing voltmeter functionality, and more particularly, enhancing voltmeter functionality for isolating faults in electrical circuitry.

2. Description of the Related Art

Modem vehicles systems incorporate digital (computer) diagnostic systems that can detect many circuit faults in electrical components and systems (e.g., on vehicles). But such systems typically cannot detect all possible circuit faults, for example, high resistance faults caused by corrosion. Moreover, electrical troubleshooting on vehicles and other systems can be time-consuming, labor-intensive, costly, and often ineffective, especially if a component must be disconnected and/or removed for testing circuit continuity.

The vast majority of circuit faults in wiring and connectors result from abuse, exposure, wear, and normal use. Failures in circuit wiring typically are caused by a change in circuit resistance and fall into one of three categories—an open circuit, a short-to-ground, or a high resistance (e.g., due to corrosion). Other faults, such as a circuit short to another circuit, can be more obvious because they typically show signs of failure that are easier to discern.

Apparatus typically used to detect electrical faults include ohmmeters, ammeters, and voltmeters. The voltmeter measures voltage (potential difference) at any open in a functional circuit, or voltage drop across a resistance with the circuit intact and operating, which is usually safer and more effective, respectively, than using the ammeter or the ohmmeter. This is because the ammeter must complete a circuit to obtain a reading and the ohmmeter must have all circuit voltage removed and the circuit completely isolated.

A typical voltmeter can, in some circumstances, be used to locate faults, such as those described above. Simply connecting and turning on the voltmeter, however, may be insufficient or inadequate to solve the problem, and require a time consuming effort to reach an incomplete conclusion. For best results the circuit must be active or energized to detect faults, which requires the circuit to be intact and the load to be installed. Further, to prevent corrosive faults from occurring, if the manufacturer intentionally designs wiring and component terminals not to be externally accessible without the component being removed, performing dynamic circuit tests with typical voltmeter leads can be impossible.

Thus, there is a need for effective and relatively inexpensive troubleshooting for detecting electrical circuit faults that is both conclusive and allows for simple dynamic testing.

SUMMARY OF THE INVENTION

In one aspect, embodiments of the invention feature circuitry for dynamic testing of a circuit under load. The circuitry includes a test load adapted to be coupled between inputs of a voltmeter, and a switch adapted to short circuit test leads of the voltmeter through the test load.

Embodiments of the invention feature enhanced voltmeter test load circuitry having a test load that can be coupled to or decoupled from the test leads of a voltmeter. The embodiments can be used to help identify the location and type of faults, such as a short-to-ground, an open circuit, and a high (e.g., corrosive) resistance, in a circuit under test. A fuse or circuit breaker can be provided with the enhanced voltmeter test load circuitry for safety reasons. The circuitry can be located within a voltmeter or test leads of a voltmeter, or portions of the circuitry can be located in both. The circuitry can be used systematically in locating and identifying the fault from voltage readings at the location of a removed component or a blown fuse or circuit breaker in the circuit under test. Voltage drop readings are obtained at various points in the circuit under test with the test load both coupled and decoupled between (or effectively coupled between) the test leads. A negative or black test lead can be moved to a convenient machine ground during the test and the test can be repeated to confirm the location of the fault. A change in reading can indicate the fault is on the ground side of the circuit under test while no change can indicate the fault is on the positive side of the circuit under test. Conventional test leads can be used if the load circuitry is incorporated or integrated in the voltmeter or if the load circuitry has a separate coupling or connection to the voltmeter inputs.

Compared to existing methods and devices, embodiments of the invention provide the ability to make a confident and conclusive decision about the type and general location of the electrical fault from component connections, with only two voltmeter readings. No circuit disassembly is required to determine the type of fault, and the user/technician is able to avoid the use of meters less safe than the voltmeter to quantify resistance and current disposition.

BRIEF DESCRIPTION OF THE DRAWINGS

Other objects and advantages of the invention will become apparent upon reading the following detailed description and upon reference to the drawings in which:

FIG. 2B is a diagram of test load circuitry in accordance with another embodiment of the invention;

FIG. 2C is a diagram of test load circuitry in accordance with another embodiment of the invention;

FIG. 8 is an exemplary flow chart of a troubleshooting method in accordance with an embodiment of the invention;

FIG. 11 is an exemplary flow chart of a troubleshooting method in accordance with an embodiment of the invention;

FIGS. 14A and 14B are an exemplary flow chart of a troubleshooting method in accordance with an embodiment of the invention.

Figure 1:
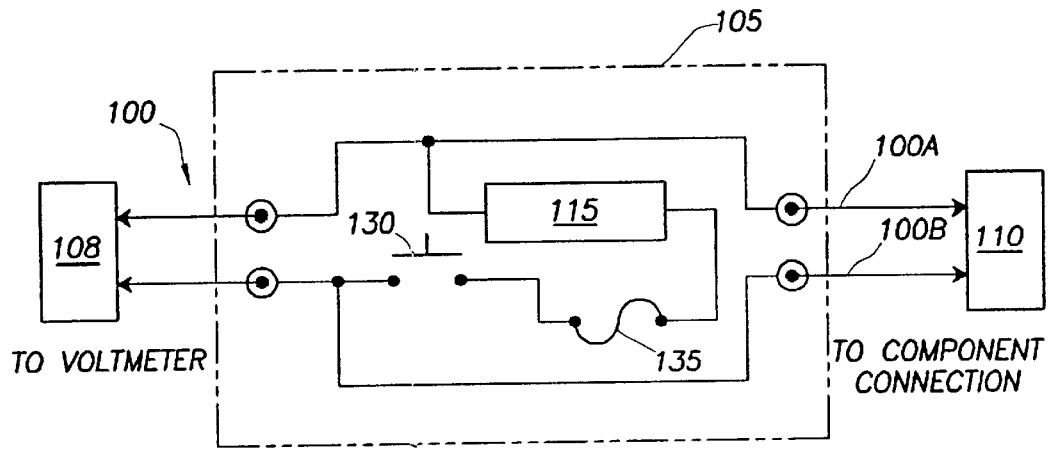
FIG. 1 is a diagram of enhanced voltmeter test load circuitry in accordance with an embodiment of the invention.

While the invention is susceptible to various modifications in alternative forms, exemplary embodiments thereof have been shown by way of example in the drawings and are herein described in detail. It should be understood, however, that the description herein of exemplary embodiments is not intended to limit the invention to the particular forms disclosed. On the contrary, the intention is to cover all modifications, equivalents, and alternatives falling within the spirit and scope of the invention as defined by the appended claims.

DETAILED DESCRIPTION OF INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developer' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

This is a continuation-in-part of Ser. No. 09/360,066, filed Jul. 23, 1999, now abandoned, which is incorporated by reference herein in its entirety.

Kirchoff's Law states that the sum of all voltage drops in a circuit must be equal to the applied voltage. Since most segments or branches of system circuits contain only one component (i.e., a main load), in operation, it can be assumed at approximately the full system voltage drop occurs across the installed component (e.g. lamp, a resistor, a motor, and the like). The difference between the applied voltage and the voltage drop is due to the perceptible yet negligible voltage drop caused by normal circuit resistance. Thus, a logical and useful troubleshooting assessment is that if the component does not drop approximately the full system voltage, then an additional resistance must be present in the circuit that results in lower-than-normal or no current flow. Embodiments of the invention advantageously offer safe, effective, and relatively quick methods and apparatus for electrical troubleshooting that can be used systematically to identify and locate these unexpected voltage drops and open circuits.

In the description below of embodiments of the invention, all tests of circuits are performed under the following general assumptions:

(1) A circuit under test is energized;

(2) Dynamic tests are made advantageously with the relevant circuit component removed;

(3) A digital voltmeter provides three typical readings: (a) a "ghost" or fluctuating reading, indicative of the two voltmeter leads being connected to two points in the circuit that are absent of potential and non-continuous; (b) a true zero reading (0.00 volts), indicative of the two voltmeter leads being connected to two points in the continuous and of identical potential; and (c) a reading of some constant voltage greater than zero, indicative of the voltmeter leads being connected to two points in the circuit that are continuous and of unequal potential.

FIG. 1 shows enhanced voltmeter test load circuitry 100 that includes load circuitry 105 adaptable to any digital voltmeter 108, in accordance with an embodiment of the invention. The enhanced voltmeter test load circuitry 100 couples to a "positive" input test lead 100A (e.g. a "red" test lead) and a "negative" input test lead 100B (e.g., a "black" test lead). The load circuitry 105 adds to the functionality of the voltmeter 108 by allowing a user/technician systematically to identify the type and location of a voltage drop caused by a fault in a circuit under test (CUT) 110. The enhanced voltmeter test load circuit 100 can help reduce or eliminate the need for additional tests or circuit modification to isolate the circuit fault by enabling dynamic circuit tests to be performed with a circuit component of the CUT 110 removed. As shown in FIG. 1, the load circuitry 105 is coupled to the leads 100A and 100B. The load circuitry 105 includes a test load 115, for example, a load, resistor, resistive load, emulated resistive load, and the like of known resistance that can couple across the leads 100A and 100B. Other non-limiting possibilities for the test load include transistors, diodes, resistive networks, and the like, as bulk or integrated circuits.

The test load 115 can be any component or circuit capable of presenting the same or similar load to the CUT 110 as the removed component (i.e., it produces a similar voltage drop). The resistance or resistive load value of the test load 115 may be determined, in non-limiting fashion, by taking an average of resistance or resistive load values of components present in systems for which the enhanced voltmeter test load circuitry 100 will be used. This value will change in various embodiments of the invention, as 115 be appreciated by those skilled in the art. For example, in another embodiment, the value could be the same as that of the component having the highest resistive load value among such system components. In another embodiment, the typical resistive loads of components in a given system incorporating the CUT 110 will be known, and the user/technician can manually adjust or switch (or activate an automatic adjustment of) the resistive load value of the test load 115 correspondingly at the load circuitry 105 or at the voltmeter 108. The adjustment in value of the test load 115 could be automated using knowledge of the maximum current allowed for the CUT 110. In another embodiment, the resistive load value of the test load 115 is adapted to drop an equivalent voltage drop to the removed component of the CUT 110. In general, the test load 115 is in effect an artificial load for the removed component from the CUT 110. The load circuitry 105 and the test load 115 thus extend the functionality of the voltmeter 108.

The load circuitry 105 also includes a switch 130 (termed an "ETL" switch, which can be a push button or other type of switch) and preferably includes, for safety reasons, a fuse or circuit breaker 135 or equivalent (referred to hereinafter simply the fuse 135). The fuse 135 limits the maximum current that can be pulled by the test load 115, ensuring that maximum current during test will remain safely below the maximum allowable for circuits such as the CUT 110. The current rating of the fuse 135 is of a value appropriate for this purpose. It is possible that the type or rating of the fuse 135 could vary with application to the particular CUT 110. A switch could be provided (not shown) to just the rating of the fuse 135 (e.g., by switching between different fuses or circuit breakers to the particular resistive load of the test load 115 to accommodate the maximum current of the CUT 110.

The switch 130 and the fuse 135 can be located on either the positive test lead 100A-side or the negative test lead 100B-side of the test load 115. A variety of other configurations for the load circuitry 105 can be envisioned. For example, the load circuitry 105 instead could be integrated within the test leads 100A and 100B or incorporated as circuitry resident in the voltmeter 108 for use with conventional or other test leads, a will be discussed below. Conventional test leads that can be directly coupled to the CUT 110 for testing the CUT 110 can also be used with (i.e., coupled to) the load circuitry 105 if the load circuitry 105 has a separate coupling or connection to the inputs of the voltmeter 108.

The resistance value of the test load 115 will of necessity be low enough so as to make it possible to detect relatively small resistance faults, and be large enough so as to limit the current through the test load 115 and the CUT 110 to a value below (or well below) the maximum allowable system current through the CUT 110. In general, the value chosen for the test load 115 should be as near to the average resistance value(s) of any or all load components that may reside in the CUT 110. For example, as a non-limiting example, the test load may have a value designed to work with a 12 volt CUT like the CUT 110 having resistive components typically between approximately 5Ω and 300Ω (or double that for a 24 volt CUT). Another non-limiting example is that the test load 11 may be required to perform a dynamic test, replacing a coil load of approximately 2000Ω. A variety of possible test load 115 values are possible depending on parameters or characteristic of the CUT 110, as will be appreciated by those skilled in the art.

In certain embodiments, the resistance or resistive load vale of the test load 15 can be variable and adjustable (e.g., between the above values). This can be accomplished with a variable resistor, a potentiometer, or a total resistance chosen from a sequence of series connected or parallel connected resistors of known resistance making up the test load 115, whether integrated in the voltmeter 108 or not. Other configurations that produce variable resistive load are possible, as will be appreciated by those skilled in the art. These other configurations are included within the scope and spirit of the present invention. In some of these embodiments, the total resistive load value can be adjusted manually by a switch (not shown) or a slide or rotating contact, or the like (not shown) at the ad circuitry 105 or at the voltmeter 108 (e.g., if the circuitry 105 were contained within the voltmeter 108), as will be appreciated by those skilled in the art. In others of these embodiments, the resistive load value can be adjusted and set automatically at the circuitry or under control of the voltmeter (e.g., if the circuitry 105 were contained within the voltmeter 108). For example, the total resistance could be set by first starting with the highest resistive load possible and then, if necessary, manually or controllably stepping down in or adjusting (or setting the) value until the highest voltmeter 108 on-scale voltage reading were obtained with a safe current level for the CUT 110 while using the voltmeter 108 as described herein. In other embodiments, the value of the test load can be set manually, automatically, or both.

Figure 2:
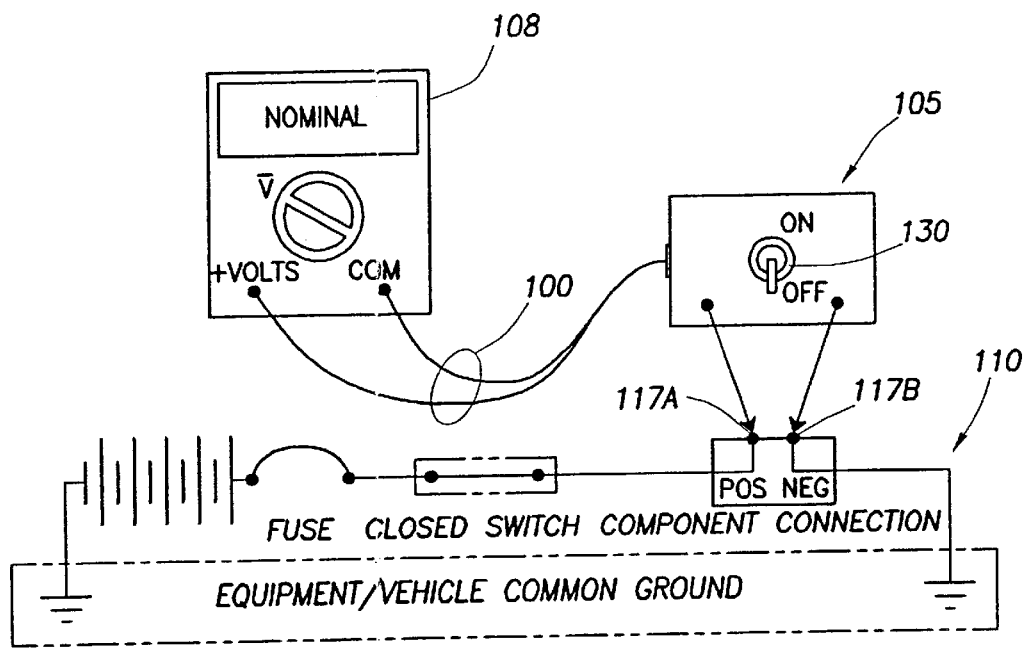
FIG. 2 illustrates the use of the test load circuitry of FIG. 1 with a circuit under test.
Figure 2A:
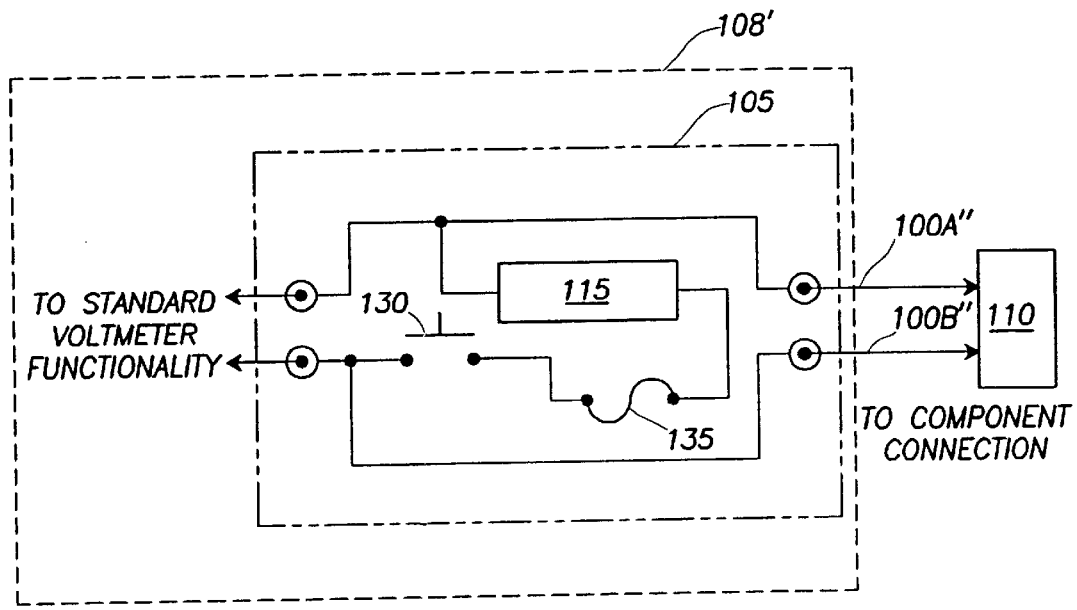
FIG. 2A is a diagram of enhanced voltmeter test load circuitry in accordance with another embodiment of the invention.

The test load 115 can be switchably coupled (i.e., "on/off" switched between switchable states) into the CUT 110. For example, the test load 115 can be coupled to the CUT 110 via the leads 100A and 100B typically after removal from the CUT 110 of a component (not shown), as illustrated in FIG. 2. Contact can be made with the leads 100A and 100B, respectively, to terminals 117A and 117B of the CUT 110 at usually couple to the component before its removal. Alternatively, as shown in FIG. 2A, the test load 115 can be coupled to the CUT 110 (the terminals 117A and 117B are not shown in FIG. 2A) via conventional leads 100A" and 100B" if the load circuitry 105 is incorporated or integrated within the voltmeter 108. The leads 100A" and 100B" can be, for example, a "positive" lead like the lead 100A and a "negative" lead lie the lead 100B, respectively. In FIG. 2A, in accordance with an embodiment of the invention, a voltmeter 108' is illustrated that includes the circuitry 105. The voltmeter 108' is like the voltmeter 108 except that the additional functionality available with the circuitry 105 as described herein is included within the voltmeter package.

With the switch 130 in the load circuitry 105 turned "on" i.e., closed), the switch 130 completes (in the sense of completing a circuit) the CUT 110 instead of the circuit component. The switch 130 short circuits the leads 100A and 100B of the voltmeter 108 (or short circuits the leads 100A" and 100B" of the voltmeter 108') for the purpose of completing the CUT 110 to make a dynamic test of the CUT 110 under load. The test load 115 can be electrically decoupled from the leads 100A and 100B (or the leads 100A" and 100B" of the voltmeter 108') and the CUT 110 by turning "off", (i.e., by opening) the switch 130 (see, e.g., FIGS. 1, 2, and 2A).

In certain embodiments, the switch 130 can be located directly in one of the leads 100A or 100B or in the lead handle of one of these leads. This is shown in FIG. 2B as lead 100A' (e.g., a "positive" lead like the lead 100A) having lead handle 100C' in which the switch 130' (like the switch 130) is located. In this case, the lead 100A' will be, for example, a three-wire lead, one wire being the usual lead wire and the other two wires coupling the switch 130' to circuitry 105' (like the remainder of the circuitry 105), as will be appreciated by those skilled in the art. In this case, the switch 130' is easily accessible by a finger or thumb of the user/technician.

Similarly, in certain other embodiments, such as is shown in FIG. 2C, the (e.g., three-wire) lead 100A' can be used with a voltmeter 108". The voltmeter 108" includes load circuitry 105", which is like the load circuitry 105' except that the load circuitry 105" is incorporated within the voltmeter 108" much like the load circuitry 105 is incorporated within the voltmeter 108'. With the voltmeter 108", as above the switch 130' is located in the lead handle 100C' of the lead 100A' for ease of accessibility. Also, like the voltmeter 108', the conventional lead 100B" is used with the voltmeter 108".

Figure 3:
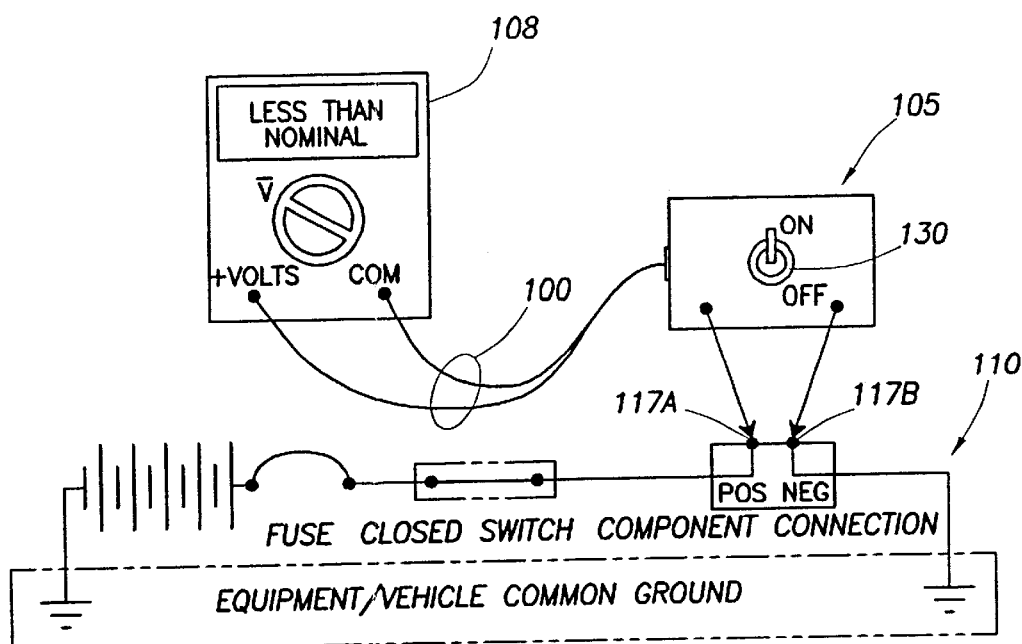
FIG. 3 illustrates the use of the test load circuitry of FIG. 1 with a circuit under test.

When the switch 130 is in the off position and no faults are in the CUT 110, a nominal standard voltage reading (e.g., system voltage from a circuit battery or other power source) is expected with the voltmeter 108, as shown in FIG. 2. With the switch 130 in the on position, as in FIG. 3, a nominal or nearly nominal (i.e., slightly less than) standard voltage reading is expected across the load 115 that completes the CUT 110 without any adjustment in the location or settings of the voltmeter 108. The nominal or nearly nominal voltage drop value is obtained in the latter situation from the series combination of the test load 115 and the negligible circuit resistance being tested under load. This difference between a static voltage test and a dynamic voltage drop test is one of the primary improvements of embodiments of the invention over existing circuit troubleshooting systems.

The operation and analysis of the results obtained when testing the CUT 110 for circuit faults assumes that the sole load in the CUT 110 is the test load 115, as discussed above. Then, a voltage drop across the test load 115 far below an expected voltage drop (e.g., well or substantially below the expected system voltage) indicates that an undesired high resistance fault exists somewhere in the CUT 110. The typical types of faults detected with embodiments of the present invention include resistance-based faults, such as a short-to-ground (short circuit or short), a high resistance (e.g., due to corrosion), or an open circuit (e.g., a blown fuse, an electrical conductor breaks, and the like). A variety of other types of faults may be detectable as well. Careful manipulation of the meter leads 100A and 100B (or the leads 110A'/100B or the leads 100A"/100B" as described above) in a specified manner will enable the user/technician to determine if the fault is "in front of" (i.e., before) or "behind" (i.e., after) the location of the removed component in the CUT 110 relative to the ground of the CUT 110. This will be discussed in more detail below.

Hereinafter, for simplicity, reference to the test leads 100A and 100B or the voltmeter 108 or the load circuitry 105 is understood to include an implied reference to the test leads 100A', 100B', 100A", and 100B" and their respective voltmeters 108' and 108" (and the load circuitry 105' and 105"). To locate circuit faults, a flow chart can guide a user/technician through a prescribed troubleshooting process that provides the steps to be followed and details the meaning of the results of each test. This can simplify fault troubleshooting and expand the capabilities of any voltmeter 108 by allowing circuit systems like the CUT 110 to be tested dynamically under load using voltage conditions and readings exclusively to identify and locate the fault, such as resistance, short or open circuit fault problems. The use of the enhanced voltmeter test load circuitry 100 obviate, in many cases, the need for either an ohmmeter or ammeter to reach a troubleshooting conclusion by using instead voltage readings to locate resistance faults and confirm current flow.

Figure 4:
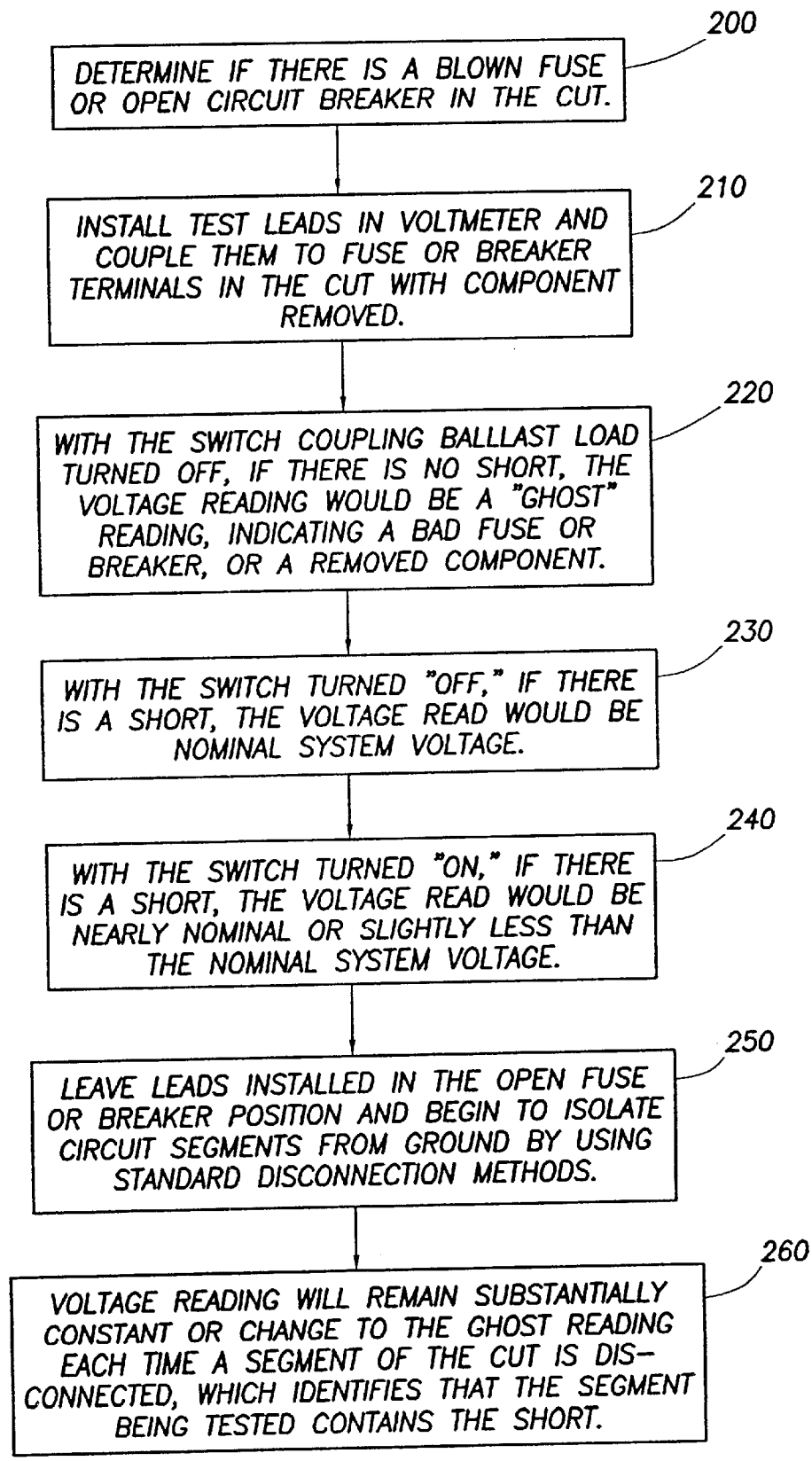
FIG. 4 is an exemplary flow chart of a troubleshooting method in accordance with another embodiment of the invention.
Figure 5:
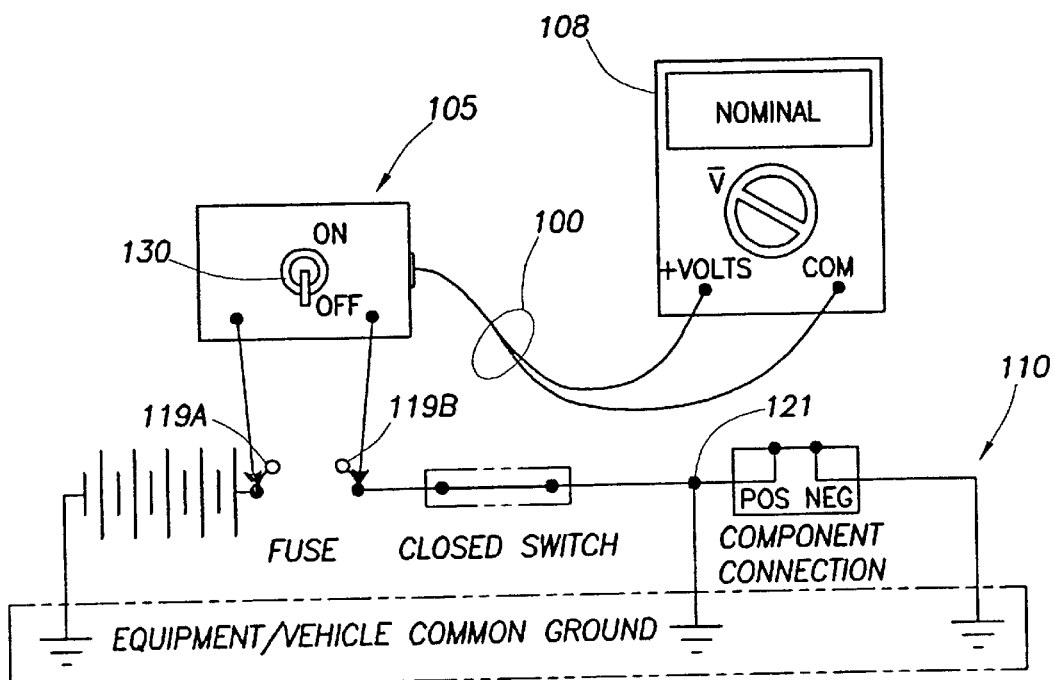
FIG. 5 illustrates the use of the test load circuitry of FIG. 1 with a circuit under test.

An exemplary flow chart of such a process or method is shown in FIG. 4, in accordance with an embodiment of the invention. Referring to FIG. 5 as well, and assuming there is a fault in the CUT 110, the user/technician determines, at block 200, whether the failed circuit contains a short-to-ground or a wiring problem by determining if there is a blown fuse or open circuit breaker in the CUT 110. Such an event is likely to occur if there is a short-to-ground. The enhanced voltmeter test load circuitry 100 (e.g., using the test leads 100A and 100B) can be installed, with the component removed, from the voltmeter 108 and coupled, at block 210, to the terminals 119A and 119B, replacing the fuse or breaker in the suspect CUT 110. The threat of further short circuit or harm is unlikely because of the input resistance (or impedance), which is typically greater than 50,000 Ohms per volt (>50$\Omega$/V), of the voltmeter 108 (e.g., when the switch 130 is off) and because of the test load 115 and the fuse 135, which are coupled to the leads (e.g., the leads 100A and 100B) (e.g., when the switch 130 is on).

With the switch 130 turned off, if there is no short, the voltage reading, at block 220, would be a "ghost" reading. This is because there is not a complete circuit since the ground of the CUT 110 has been removed by removal of the component. If the user/technician turns the switch 130 on, a ghost reading would again be obtained. The ghost reading is due to the peculiar characteristics of a digital voltmeter. Such a voltmeter is sensitive enough that it would float (i.e., detect and read a fluctuating static or earth-magnetic voltage with the test leads, e.g., the leads 100A and 100B isolated from each other while on a millivolt range). Touching the test leads 100A and 100B together would produce, of course, a reading of zero volts on the voltmeter 108, because the potential difference between the test leads 100A and 100B disappears. These fundamental readings may be considered "normal" for a correctly operating circuit with the component removed and the test leads connected in place of the fuse 135.

Figure 6:
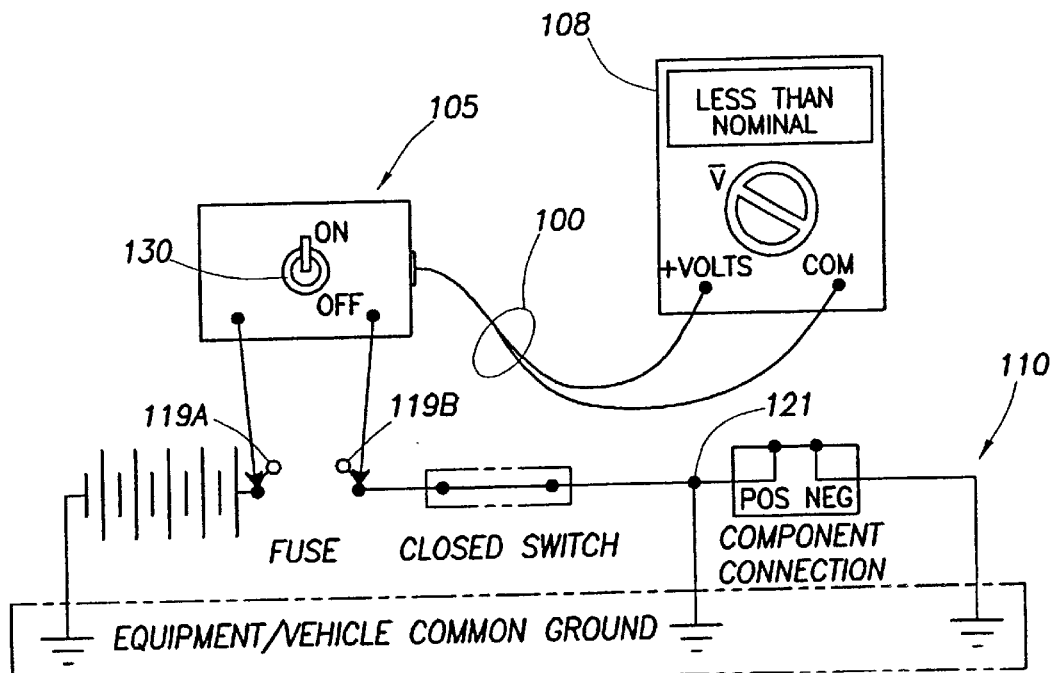
FIG. 6 illustrates the use of the test load circuitry of FIG. 1 with a circuit under test.
Figure 7:
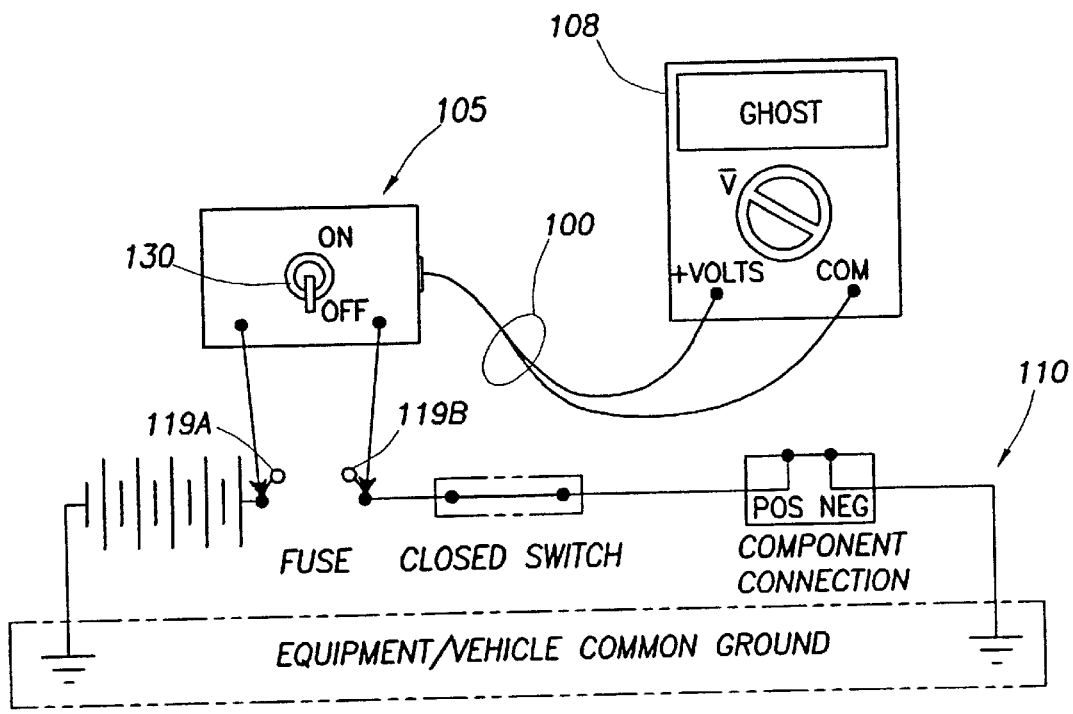
FIG. 7 illustrates the use of the test load circuitry of FIG. 1 with a circuit under test.

If, however, there is a short-to-ground and the switch 130 is off, at block 230, the voltmeter 108 would read the nominal system voltage due to the presence of an inadvertent circuit ground caused by the fault. With the voltmeter 108 set to acquire the voltage across the open fuse or breaker position of the CUT 110, as shown in FIG. 6, if the switch 130 is turned on and a short circuit exists, at block 240, the voltmeter 108 would indicate nearly the nominal system voltage or slightly less. A reading significantly lower than the nominal system voltage indicates the presence of the short 121 with some added (e.g., corrosive) resistance. To locate the short 121, at block 250, the user/technician would leave the leads 100A and 100B installed in the open fuse or breaker position of the CUT 110, and begin to isolate circuit segments from ground by using standard disconnection methods (i.e., disconnection of connectors, switches, terminals, and the like). Each time a segment of the CUT 110 is disconnected, at block 260, the voltage reading either would remain substantially constant (e.g., at or near the nominal system voltage) or change to a ghost reading, as shown in FIG. 7. The ghost reading again indicates a loss of ground (in this case, the loss of the inadvertent ground caused by the short-to-ground 121), and provides the ability for the user/technician to identify the segment or section of the CUT 110 being tested that includes the short 121.

If the circuit fault is not a short-to-ground (as indicated by the circuit fuse or circuit breaker remaining intact), reference is made to FIG. 8. Using the CUT 110 component connections 117A and 117B as reference, CUT faults caused by an open circuit or unintentional high resistance can occur only in the wiring either on the positive side (i.e., in front of) or on the negative side (i.e., behind) the component connections 117A and 117B. Once it has been determined (at block 300 discussed below) that the fault is one of these two types (i.e., an open circuit or high resistance) as described above, the user/technician will repeat the initial test (at block 320 discussed below) after removing the negative lead 100B to a convenient machine ground (see blocks 350 and 430 (FIG. 11) discussed below). This action has the effect of removing the ground portion of the CUT 110 (e.g., the wiring "behind" the component connection 117B), thereby allowing the circuit to be isolated to a degree. This further affords an opportunity to use a process of elimination to locate the fault relative to the component connections 117A and 117B.

In the case of the open or high resistance fault, if the abnormal reading (e.g., a ghost reading in the case of an open circuit, or a substantially lower than normal reading in the case of a high resistance) remains once the negative lead 100B is removed to a machine ground, then the fault must be located in the positive side of the CUT 110. If the reading changes to a "normal" reading under the same circumstances, then the fault must be in the negative side of the CUT 110.

In either circumstance, that is, in either the case of an open circuit or high resistance fault, the user/technician compares the reading taken initially with the reading taken after removing the lead 100B to a machine ground. It is this expected change in the reading of the voltmeter 108 that differentiates embodiments of the invention from any other existing device. The load circuitry 105 essentially mimics the electrical effect of the CUT 110 load (i.e., the component to be removed), thereby allowing a dynamic voltage drop reading rather than simply a static voltage reading.

Returning to FIG. 8 for more detail, the user/technician couples, at block 300, the test leads 100A and 100B of the voltmeter 108 on the CUT 110, replacing the component normally resident in the CUT 110. At block 310, if the CUT 110 were a complete circuit (e.g., no short or open circuits), the voltmeter 108 would indicate nominal system voltage with the switch 130 turned off. If the CUT 110 is complete, as indicated by the presence of a nominal voltage reading, the user/technician then activates, at block 320, the enhanced voltmeter test load circuitry 100 by closing the switch 130 to couple in the test load 115. At block 330, if the voltmeter 108 reading remains substantially constant at the nominal system voltage or drops only slightly, then the user/technician can assume that no additional undesired resistance exists in the CUT 110 and the component itself that was removed probably has failed. This is because any added resistance (e.g. if there were no open circuit) in the CUT 110 would cause the voltmeter 108 reading to drop significantly due to the added voltage drop, according to Kirchoff's Law. At block 340, on the other hand, if the CUT 110 has an open circuit 138, as shown in FIGS. 9A and 9B, with the switch 130 turned off (or on), the voltmeter 108 would indicate a ghost reading.

Figure 9A:
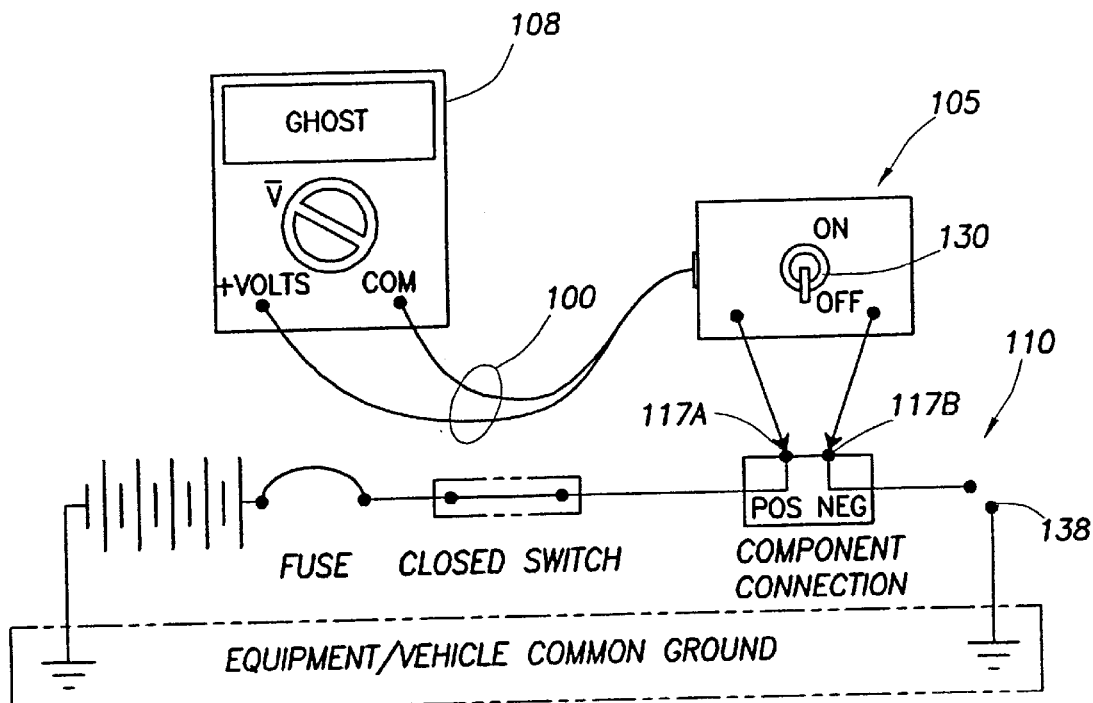
FIGS. 9A and 9B illustrate the use of the test load circuitry of FIG. 1 with a circuit under test.
Figure 9B:
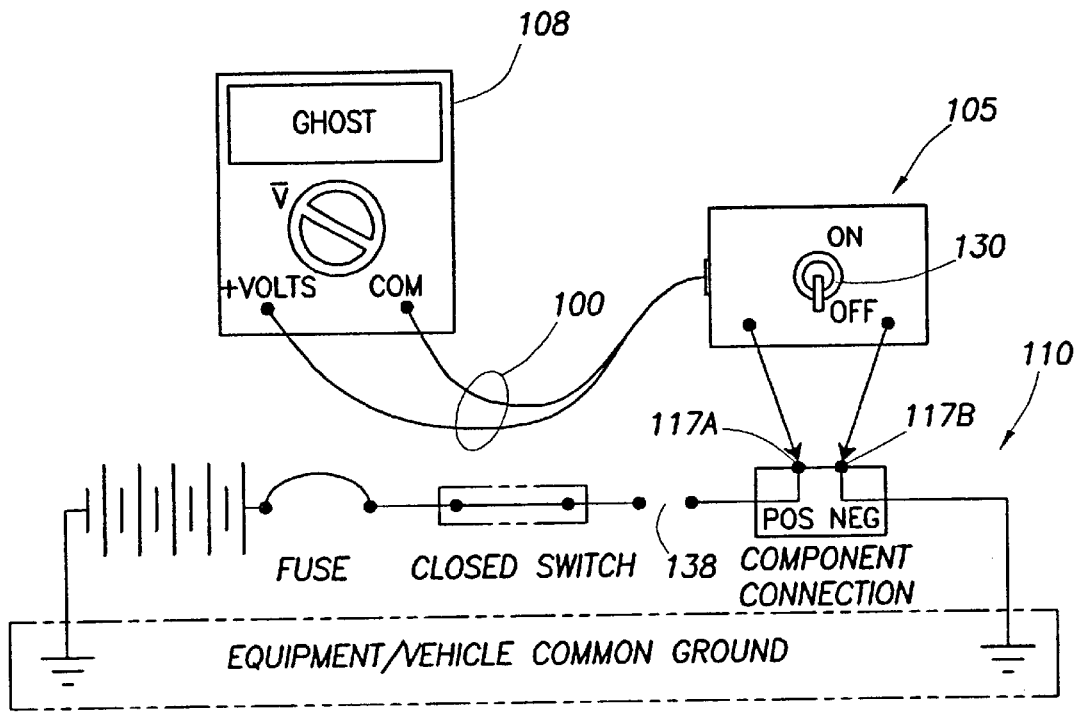
Figure 10A:
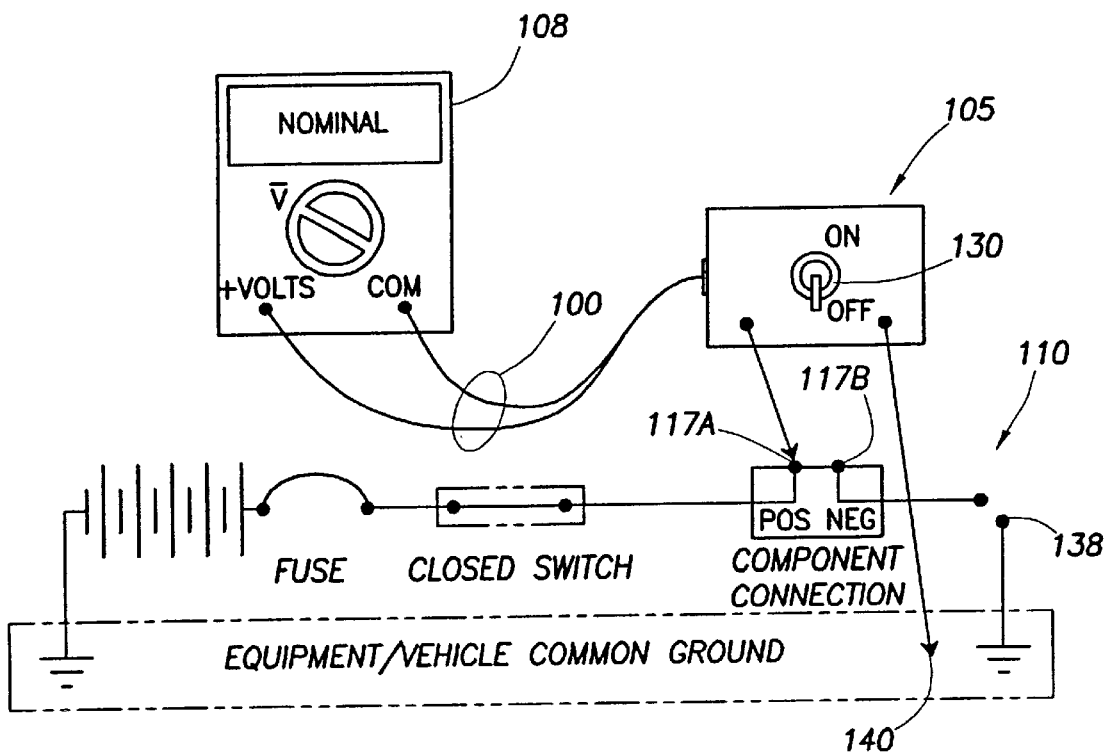
FIGS. 10A and 10B illustrate the use of the test load circuitry of FIG. 1 with a circuit under test.
Figure 10B:
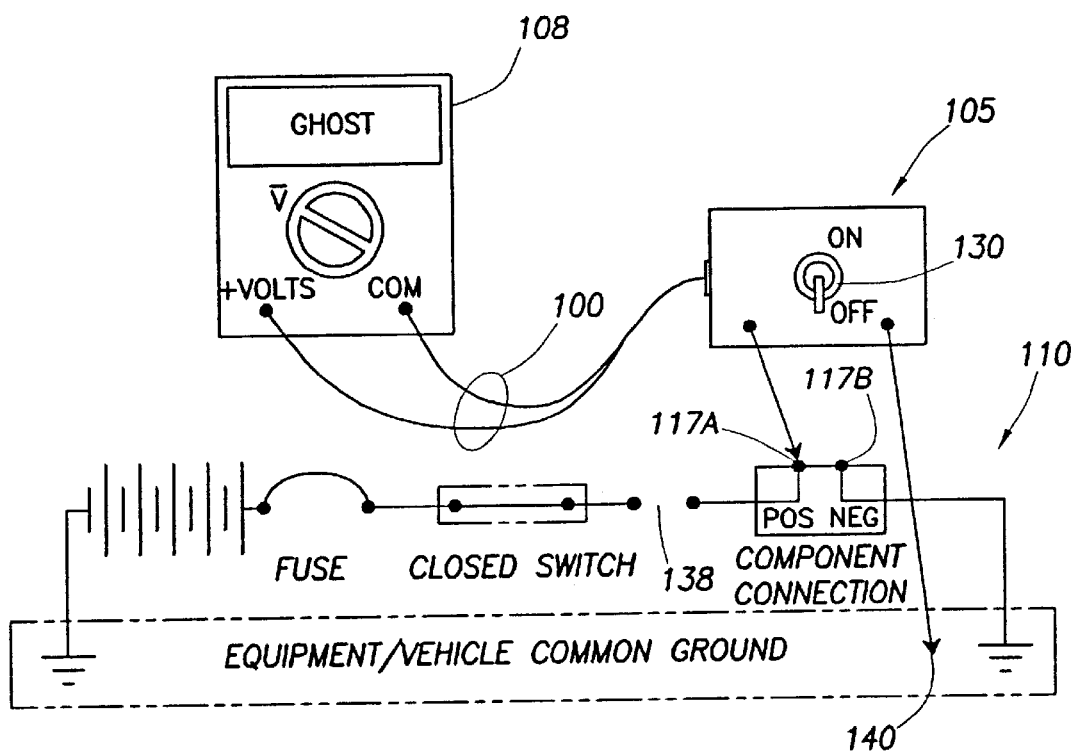

Once it has been determined that the circuit likely has failed due to an open circuit or high resistance fault, the user/technician can remove, at block 350, the negative input test lead 100B to the voltmeter 108 from the component connection terminal 117B and couple the lead 100B to a convenient machine ground 140 (see FIGS. 10A and 10B, corresponding to FIGS. 9A and 9B, respectively). This action has the effect of removing the ground portion of the circuit from the test and allows the test to use the process of elimination to isolate the location of the fault. At block 360, if the open circuit 138 is on the ground side of the terminal 117B and the switch 130 is off (FIG. 10A), then the reading on the voltmeter 108 would be the nominal system voltage. If the switch 130 instead is on (not shown), then the reading would be nearly or slightly less than the nominal system voltage. This will help the user/technician to identify that the segment of the CUT 110 containing the open circuit 138 is on the ground side of the component terminal 117B. If, however, the reading is substantially below the nominal system voltage (with the switch 130 on), then this indicates the presence of a high resistance fault, as discussed above, on the battery or other power source side of the terminal 117A. On the other hand, if, at block 370, the open circuit were on the battery or other power source side of the terminal 117A, then the reading on the voltmeter 108 would remain a ghost reading (see FIGS. 10A and 10B). This is true regardless of whether the negative input lead 100B remains coupled to the terminal 117B or is coupled to the machine ground 140, and whether or not the switch 130 is on or off. The user/technician would then repeat, at block 380, the test described above at block 320, with reference to FIG. 10A, relying on the disappearance of the ghost reading and the appearance of the nominal system voltage reading to help identify to the user/technician the segment of the CUT 110 with the open circuit 138.

In the case of testing for either a high resistance or open circuit fault, both tests are functionally identical. The difference in conclusion is based upon the meter readings that result from each unique condition.

Figure 12A:
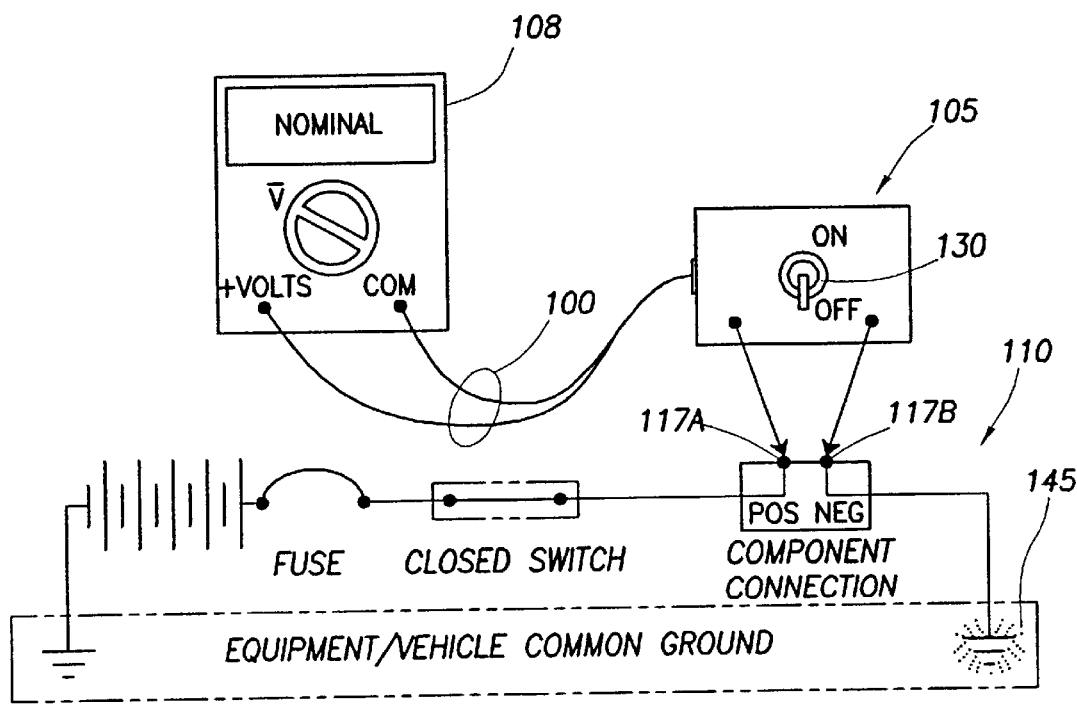
FIGS. 12A, 12B and 12C illustrate the use of the test load circuitry of FIG. 1 with a circuit under test.
Figure 12B:
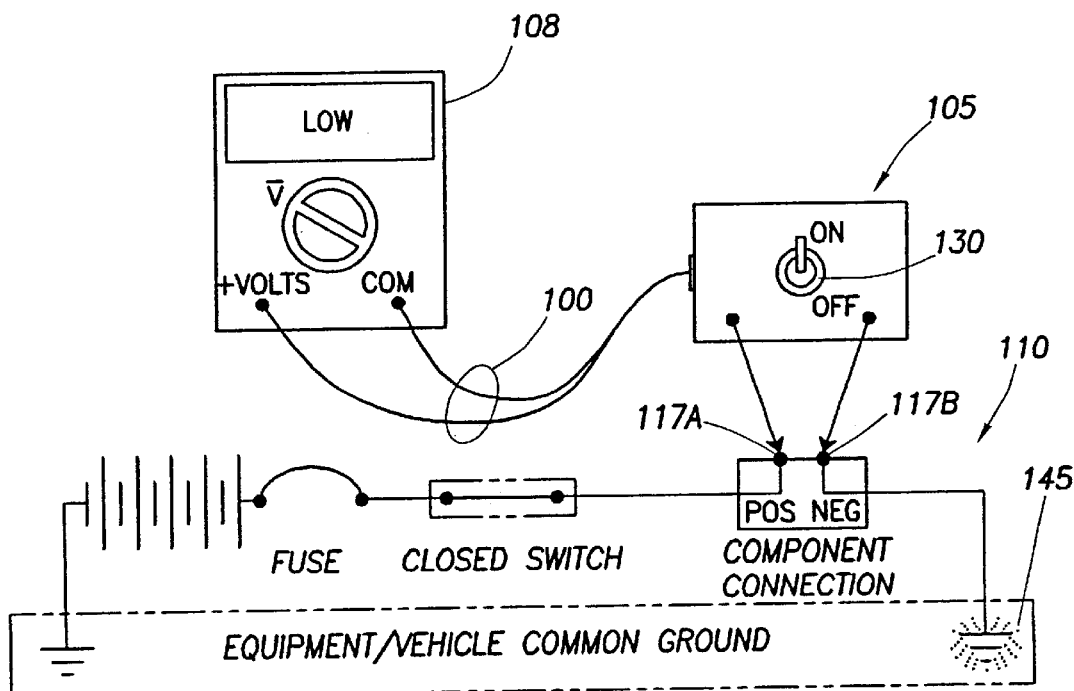
Figure 12C:
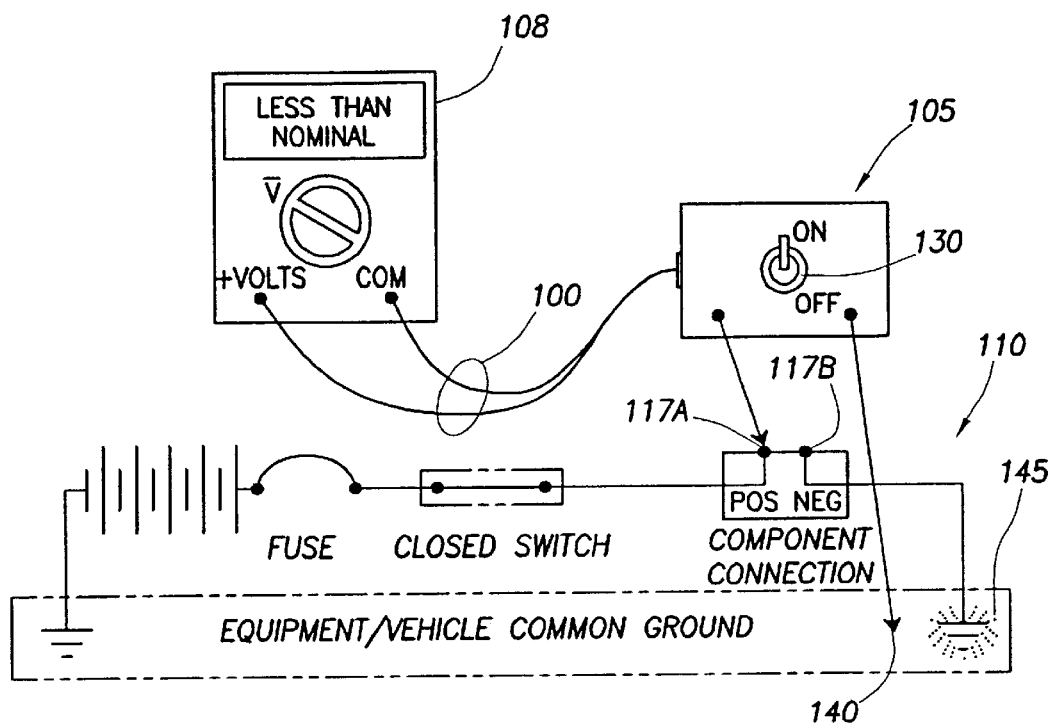
Figure 13A:
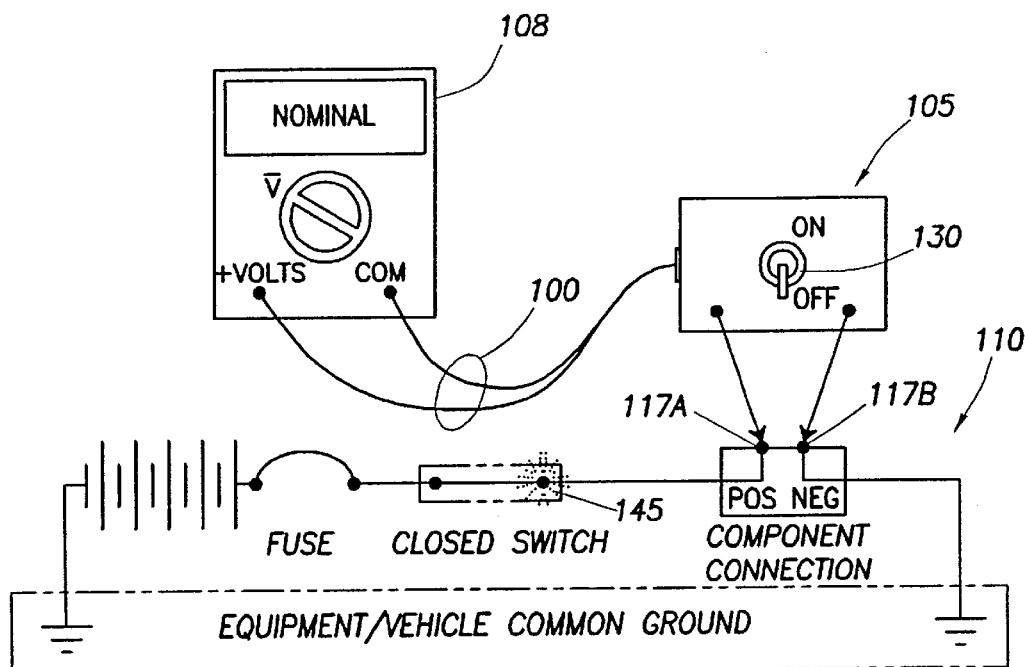
FIGS. 13A, 13B and 13C illustrate the use of the test load circuitry of FIG. 1 with a circuit under test.
Figure 13B:
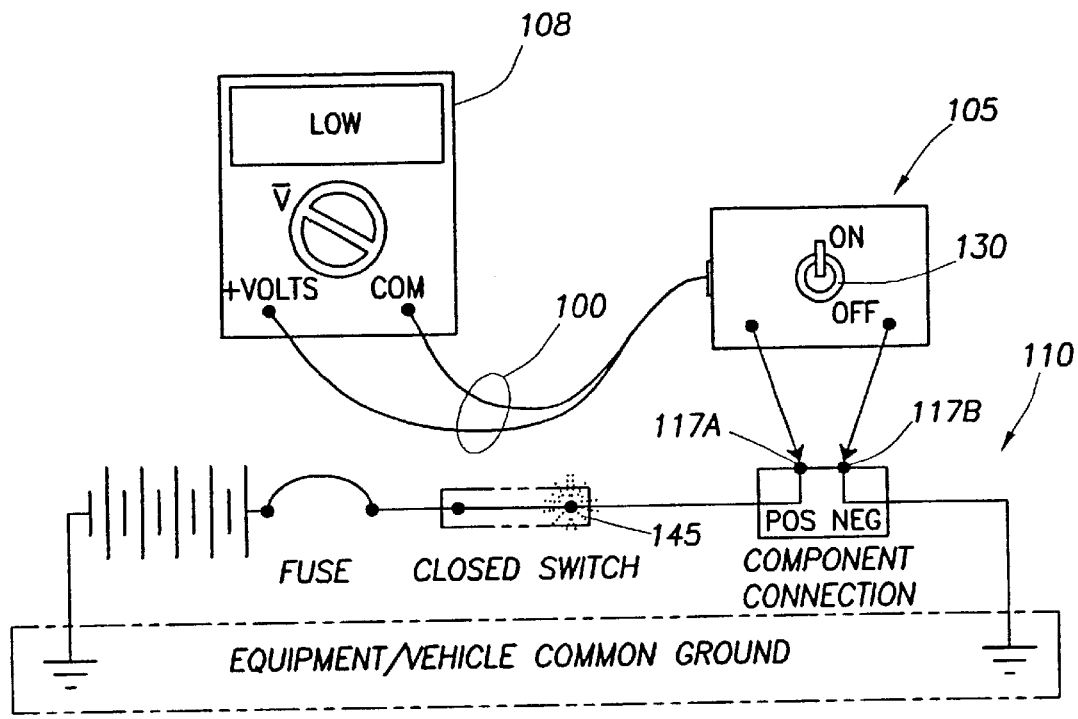
Figure 13C:
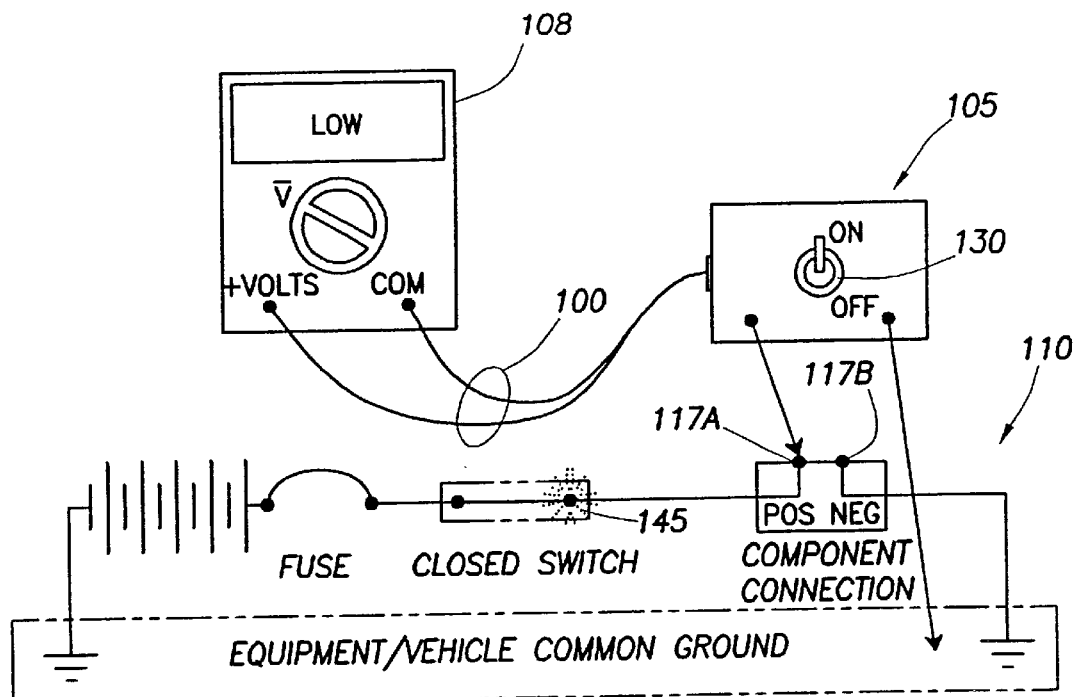

Reference is made to FIG. 11, which can continue from block 330 in FIG. 8 with the test leads 100A and 100B coupled to the terminals 117A and 117B. At block 400, if the voltmeter 108 reading drops significantly below the nominal system voltage with the switch 130 significantly below the nearly (or slightly less than nominal system voltage with the switch 130 on), then the only cause would be an added high resistance fault in the CUT 110. FIGS. 12A and 13A show the situation with the switch 130 off and a high resistance fault 145 located on the ground side and on the battery or other power source side of the component terminals 117A and 117B, respectively. In both situations, at block 410, the voltmeter 108 would read the nominal system voltage, given that there is no current flow in the CUT 110 and the meter is sensitive enough to allow a full system voltage reading though a significant resistance. FIGS. 12B and 13B show the analogous situations to FIGS. 12A and 13A with the switch 130 on, respectively. With the switch 130 on, at block 420, the voltmeter 108 would read a low value because the voltage drop reading across the test load 115 is a voltage-divided value and is only a portion of the full circuit voltage drop. This low value is less than the previously referred to nearly or slightly less than nominal system voltage. The user/technician then would remove, at block 430, the negative input test lead 100B, as before, from the component terminal 117B and place it onto the convenient machine ground 140. The user/technician would then, at block 440, make the same observations described above for block 420 (FIGS. 12C and 13C). With the switch 130 on (or off), at block 450, if the voltmeter 108 reading rises to, or nearly to, or is slightly less than, the nominal system voltage, then the high resistance fault is located on the ground side of the CUT 110, after the component terminal 117B, as shown in FIG. 12C. On the other hand, if the reading remains substantially constant with the switch 130 on, at block 460, then the high resistance fault is located on the battery or other power source side of the CUT 110 in front of or before the component terminal 117A, as shown in FIG. 13C. Thus, if the user/technician leaves the test leads 100A and 100B in place during visual inspection and testing of connections, terminals, and the like, of the CUT 110, when the voltmeter 108 reading rises to a normal reading (e.g., at, nearly to, or slightly less than, the nominal system voltage), then the high resistance would be bypassed or corrected. This can aid the user/technician in locating and identifying the segment of the CUT 110 having the high resistance fault.

Figure 14B:
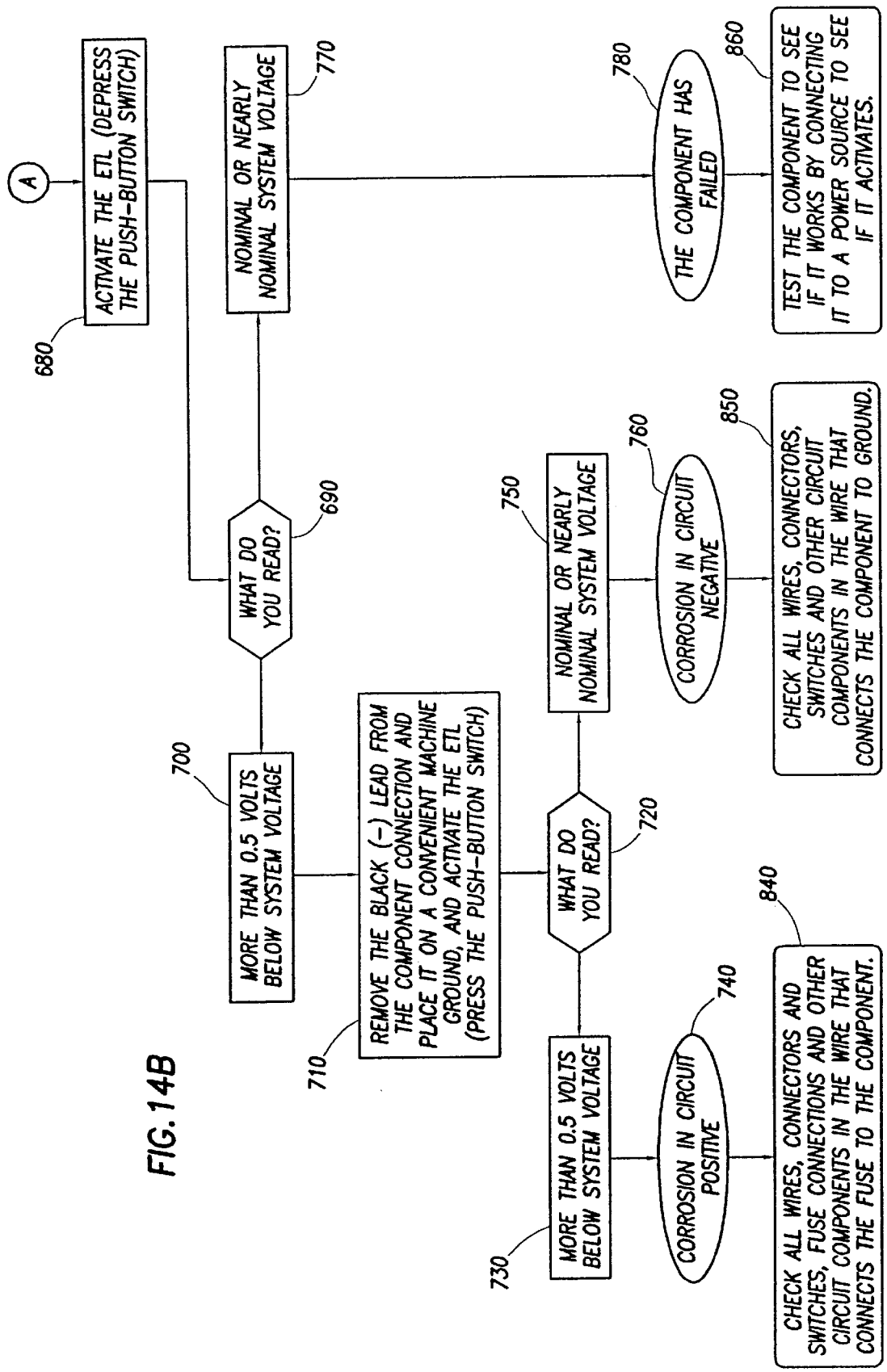

FIGS. 14A and 14B are a simplified flowchart diagram of a method in accordance with an embodiment of the invention for troubleshooting a CUT, such as the CUT 110. FIGS. 14A and 14B, in a simple and systematic method, summarize, combine, and add to the descriptions of procedures that were provided above in more detail. At block 500, the user/technician determines whether or not the fuse or circuit breaker is blown (i.e., the fuse or circuit breaker in the CUT). If the fuse or circuit breaker is blown, then it is assumed that the CUT has a short-to-ground fault. On the other hand, if the fuse or circuit breaker is not blown, then it is assumed that the fault would either be due to an open circuit or a high resistance. If the fuse or circuit breaker is blown, at block 510, the user/technician turns off the battery master switch (not shown in the drawings) and the CUT on/off switch (see e.g., FIG. 5 for an indication of the CUT on/off switch), and replaces the fuse with another of the correct rating. At block 520, the user/technician turns on the battery master switch (if present). At block 530, the user/technician determines again if the fuse or circuit breaker blows. If the fuse or circuit breaker does blow, at block 540, this indicates that the short-to-ground is in front of (before) the CUT on/off switch. The user/technician, at block 790, then installs the test leads (e.g., leads 100A and 100B) into the CUT in place of the fuse or circuit breaker (e.g., at the terminal 119A and 119B) and checks to see that the voltmeter (e.g., the voltmeter 108) reads nominal system voltage. The user/technician should check all wiring in that part of the circuit that connects the fuse or battery to the CUT on/off switch. The confirmation of the correction of the fault will be if the voltmeter reads a ghost reading.

Returning to block 530, on the other hand, if the fuse or circuit breaker is not blown, then, at block 550, the user/technician turns on the CUT on/off switch. The user/technician then determines, at block 560, whether the fuse or circuit breaker blows. If the fuse or circuit breaker blows, then, at block 570, the short-to-ground is behind (after) the CUT switch. Then, at block 800, the user/technician installs the test leads into the CUT in place of the fuse or circuit breaker (e.g., at the terminals 119A and 119B) and checks to see that the voltmeter reads nominal system voltage. The user/technician should check all wiring in that part of the CUT that connects the CUT switch to the component. The confirmation of the correction of the fault will be if the voltmeter reads a ghost reading. If, at block 560, the fuse or circuit breaker instead is not blown, then, at block 580, the short-to-ground is intermittent. At block 810, an intermittent short will require that the user/technician attempt to determine when the short occurs—either before or after the CUT switch is closed—and then use the appropriate method described above at blocks 790 or 800.

Returning to block 500, if the fuse or circuit breaker instead is not blown, then, at block 590, the user/technician removes the component in the effected CUT (e.g., light bulb, solenoid, relay coil, horn and the like) and turns the CUT on. At block 600, the user/technician makes sure the voltmeter is on the correct voltage setting (AC or DC) and that the voltmeter is set to auto-range (preferred) or on the correct range. The user/technician connects the enhanced test leads into the CUT in place of the component (e.g., at the terminals 117A and 117B), making sure the polarity is correct (e.g., red lead on (+) and black lead on (−)). Polarity is important, and if the user/technician sees the negative sign (−) on the voltmeter face, the leads are connected backwards. At block 610, the user/technician then determines the reading on the voltmeter. At block 620, if the voltmeter reads true zero volts (0.00V), then at block 650, there is probably a short-to-ground in conjunction with an open circuit. At block 820, if the voltmeter reads true zero volts, then the only cause can be from the leads being in contact with each other through the CUT and/or ground. This condition indicates that the CUT is cut (i.e., broken) between the switch and the component, and the wire connected to the component is touching ground. The confirmation of the correction of the fault will be the voltmeter reading a nominal voltage.

Returning to block 610, if the voltmeter reads a ghost reading, at block 640, then, at block 670, the CUT is open. The user/technician then, at block 830, moves the black lead (e.g., 100B) to a machine ground and rereads the voltmeter. If the reading changes to a nominal voltage reading, then the fault is in the ground. If the voltmeter reading remains a ghost reading, then the fault is in the positive portion of the CUT. In either case, the user/technician should check the appropriate wiring for failed or broken connections, or for a wire that is cut or otherwise disconnected.

Returning again to block 610, if the reading is nominal system voltage or nearly nominal system voltage at block 630, then, at block 660, the CUT is either corroded or the component has failed. The user/technician then, at block 680 (see FIG. 14B through tab A from block 660 in FIG. 14A), activates (i.e., closes or depresses) the (ETL) switch 130 in the leads 100A and 100B to engage the test load 115 in the CUT. At block 690, the user/technician determines the voltmeter reading. If the voltmeter reads nominal system voltage or nearly nominal system voltage, at block 770, then, at block 780, the component has failed. Reaching this point, at block 860, indicates that there are no readable faults or unexpected resistance in the CUT causing an extra voltage drop, and the user/technician should test the component by connecting it to an independent power source to see if it activates or has failed.

Returning to block 690, if, on the other hand, the voltmeter reads, at block 700, significantly below the system voltage (e.g., more than 0.5 volts below system voltage), at block 710, the user/technician then removes the black (−) lead from the component connection, places it upon a convenient machine ground, and activates the switch 130 in the enhanced voltmeter test load circuitry 100. The user/technician then, at block 720, determines a voltmeter reading. If, at block 730, the reading is again significantly below the system voltage (e.g., more than 0.5 volts below system voltage), then, at block 740, there is added resistance corrosion in the CUT positive side, most likely caused by corrosion. At block 840, the user/technician then should check all wires, connectors and switches, fuse connections and other CUT components in the wire that connects the fuse to the component. Even small amounts of rust or other corrosion can cause the CUT to not operate.

Returning to block 720, if, on the other hand, the voltmeter reads, at block 750, nominal system voltage or nearly nominal system voltage (i.e., changes from low to nominal), then, at block 760, corrosion (high resistance) is present in the CUT negative or ground side. At block 850, the user/technician should check all wires, connectors, switches, and other circuit components in the wire that connects the component to ground for rust or other corrosion. Even small amounts of rust or other corrosion can cause the CUT to not operate.

Thus, FIGS. 14A and 14B provide the user/technician a workable and systematic procedure to determine the type and location of common circuit faults in electrical systems. Other modifications of these procedures are contemplated, which are included in the spirit and scope of the invention.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above might be altered or modified and all such variations are considered within the scope and spirit of the invention. Accordingly, the protection sought herein is as set forth in the claims below.

What is claimed is:

1. Circuitry for dynamic testing of a circuit under load, comprising:
   a test load adapted to be coupled between inputs of a digital voltmeter, the test load replacing a component of the circuit under load; and
   a switch adapted to short circuit test leads of the voltmeter through the test load.

2. The circuitry of claim 1, wherein the switch is adapted to be closed to complete the circuit under load.

3. The circuitry of claim 1, wherein the switch, when closed, is adapted to allow dynamic testing of the circuit under load.

4. The circuitry of claim 1, wherein the test load and the switch are incorporated in the voltmeter.

5. The circuitry of claim 1, wherein the test leads comprise conventional test leads.

6. The circuitry of claim 1, wherein the test load comprises a resistive load.

7. The circuitry of claim 1, wherein the test load comprises a load adapted to drop an equivalent voltage drop to a removed component of the circuit under load.

8. A method for dynamic testing of a circuit under load, the method comprising:
- removing a component from the circuit under load;
- coupling leads of a digital voltmeter to remaining terminals of the removed component in the circuit;
- closing a switch to short circuit inputs of the digital voltmeter through a test load; and
- making dynamic tests of the circuit under load using the digital voltmeter, the test load completing the circuit under load.

9. The method of claim 8, further comprising using a test load of comparable resistive load value as the removed component.

10. The method of claim 8, wherein the completing the circuit under load comprises ensuring that a maximum current in the circuit under load remains below a maximum allowable for circuit under load.

11. An enhanced functionality digital voltmeter comprising:
- circuitry for dynamic testing of a circuit under load, comprising:
  - a test load adapted to be coupled between inputs of a digital voltmeter, the test load replacing a component of the circuit under load; and
  - a switch adapted to short circuit test leads of the digital voltmeter through the test load.

12. The enhanced voltmeter of claim 11, further comprising test leads adapted to be coupled to the circuit under load and to couple the test load to the circuit under load.

13. A method of enhancing digital voltmeter functionality, the method comprising:
- incorporating, in a digital voltmeter, circuitry for dynamic testing of a circuit under load, comprising:
  - incorporating a test load adapted to be coupled between inputs of the digital voltmeter for replacing a component of the circuit under load; and
  - incorporating a switch adapted to short circuit test leads of the digital voltmeter through the test load.

14. The method of claim 13, further comprising coupling test leads of the voltmeter to the circuit under load.

15. The method of claim 14, further comprising dynamically testing the circuit under load to identify the type and location of circuit faults in the circuit under load.

16. The method of claim 14, further comprising jumping the leads together through the test load.

17. The method of claim 13, further comprising incorporating a variable test load in the voltmeter for applicability to different circuits under load.

18. The method of claim 13, further comprising incorporating a current limiting fuse or circuit breaker.

19. The method of claim 13, further comprising incorporating the switch for accessibility by a user/technician.

20. The method of claim 13, further comprising providing the test load as an equivalent load of a component removed from the circuit under load.

21. The method of claim 13, further comprising providing the test load as an artificial load of the circuit under load.

22. Circuitry for use in identifying a fault in a circuit under test, comprising:
- a test load adapted to be coupled between test leads of a digital voltmeter; and
- a switch adapted, when closed, to couple the test load between the test leads and, when opened, to decouple the test load from the test leads, wherein when the test leads are coupled to the circuit under test and the switch is closed, the test load replaces a component of the circuit under test.

23. The circuitry of claim 22, further comprising a fuse or circuit breaker adapted to help avoid a further fault in the circuit under test.

24. The circuitry of claim 22, wherein the test load is adapted to be in parallel with an input resistance of the voltmeter.

25. The circuitry of claim 22, wherein the test load is adapted to couple to the circuit under test for taking a voltage drop reading by the digital voltmeter across the test load when the switch is closed while the circuit under test is tested for identifying the type and location of the fault in the circuit under test.

26. The circuitry of claim 25, wherein the voltage is read when the test load is decoupled from the circuit under test also for identifying the type and location of the fault.

27. The circuitry of claim 22, wherein conventional test leads can be used with the voltmeter.

28. The circuitry of claim 22, wherein the test load and the switch are integrated in the voltmeter.

29. The circuitry of claim 28, wherein conventional test leads can be used with the voltmeter.

30. The circuitry of claim 22, wherein the test load comprises a resistor.

31. The circuitry of claim 22, wherein the test load is adapted to be coupled to complete the circuit under test where a component of the circuit under test has been removed.

32. The circuitry of claim 22, wherein the test load and the switch are adapted to help determine the type and location of the fault by following a systematic procedure of testing the circuit under test that comprises combining the position where the test leads are coupled to the circuit under test and whether or not the test load is coupled between the test leads.

33. The circuitry of claim 22, wherein voltage readings obtained on the voltmeter with the test load coupled between the test leads comprise a nominal system voltage or a nearly nominal system voltage of the circuit under test, or a ghost reading upon loss of ground to the circuit under test.

34. The circuitry of claim 22, wherein the test load is adapted to replace a component in the circuit under test.

35. The circuitry of claim 22, wherein the test load is adapted to replace a fuse or circuit breaker in the circuit under test.

36. The circuitry of claim 22, wherein the test load is adapted to couple to the circuit under test and to be used in performing a dynamic voltage drop test rather than a static voltage test of the circuit under test.

37. The circuitry of claim 22, wherein the test load is adapted to provide a parallel voltage drop with the voltmeter.

38. The circuitry of claim 22, wherein interpretation of results of voltage readings with the voltmeter with or without the test load coupled between the test leads enables the fault to be located and its type identified in the circuit under test.

39. The circuitry of claim 22, wherein the test load is adapted to couple to the circuit under test for taking a voltage reading by the digital voltmeter across the test load when the test leads are coupled to the circuit under test in a procedure for identifying the type and location of the fault in the circuit under test.

40. The circuitry of claim 22, wherein the test load is adapted to decouple from the circuit under test for taking a voltage reading by the digital voltmeter when the test leads are coupled to the circuit under test in a procedure used for identifying the type and location of the fault in the circuit under test.

41. The circuitry of claim 22, wherein the test load is adapted to couple to the circuit under test in series with a corrosive fault in the circuit under test when the test leads are coupled to the circuit under test for finding a voltage reading by the digital voltmeter across the test load for isolating the corrosive fault in the circuit under test.

42. The circuitry of claim 22, wherein the test load is adapted to couple to the circuit under test for taking a voltage reading by the digital voltmeter across the test load when the test leads are coupled to the circuit under test not for measuring a resistive fault to ground.

43. The circuitry of claim 22, wherein the test load is adapted to couple to the circuit under test for taking a voltage reading by the digital voltmeter across the test load when the test leads are coupled to the circuit under test for locating a corrosive fault in the circuit under test.

44. Test leads for testing a circuit under test with a digital voltmeter, comprising:
    a first test lead;
    a second test lead; and
    a load adapted to be switchably coupled between the first and second test leads such that, in one switchable state, the load completes the circuit under test, replacing a component of the circuit under test.

* * * * *